United States Patent [19]

Bauer et al.

[11] Patent Number: 4,985,741
[45] Date of Patent: Jan. 15, 1991

[54] MOS-CONTROLLED BIPOLAR POWER SEMICONDUCTOR COMPONENT

[75] Inventors: Friedhelm Bauer; Thomas Stockmeier, both of Würenlingen, Switzerland

[73] Assignee: Asea Brown Boveri Ltd., Baden, Switzerland

[21] Appl. No.: 546,911

[22] Filed: Jun. 14, 1990

[30] Foreign Application Priority Data

Jun. 30, 1989 [CH] Switzerland ............... 2440/89

[51] Int. Cl.⁵ .............................. H01L 29/72
[52] U.S. Cl. .................... 357/34; 357/23.4; 357/23.14; 357/38; 357/43; 357/86
[58] Field of Search ............ 357/23.4, 23.14, 34, 357/38, 43, 86

[56] References Cited

U.S. PATENT DOCUMENTS 4,914,496 4/1990 Nakagawa et al. ............ 357/38

OTHER PUBLICATIONS

IEEE Electron Device Letters, vol. EDL-6, No. 8, Aug. 8, 1985, T. P. Chow et al.: "The Effect of MOS Channel Length on the Performance of Insulated Gate Transistors", pp. 413–415.

Primary Examiner—Edward J. Wojciechowicz
Attorney, Agent, or Firm—Oblon, Spivak, McClelland, Maier & Neustadt

[57] ABSTRACT

In an MOS-controlled bipolar power semiconductor component, a recombination layer (10), which is doped with the same polarity as the base layer but more highly, is inserted, starting with the structure of an IGBT, into the base layer between anode (A) and cathode (K), which recombination layer divides the base layer into an upper and lower base layer (7a and 7b, respectively). The resultant structure forms a series circuit of MOSFET (T) and PIN diode (D) which is free of latch-up and provides the possibility of higher blocking voltages.

9 Claims, 3 Drawing Sheets

MOS-CONTROLLED BIPOLAR POWER SEMICONDUCTOR COMPONENT

BACKGROUND OF THE INVENTION

FIELD OF THE INVENTION

The present invention relates to the field of power electronics. In particular, it relates to an MOS-controlled bipolar power semiconductor component, comprising (a) a semiconductor substrate with an anode and a cathode;

(b) an emitter layer on the anode side in the semiconductor substrate, in the center a base layer doped oppositely to the emitter layer, and on the cathode side a plurality of collector regions which protrude from the surface of the semiconductor substrate into the base layer and are doped with the same polarity as the emitter layer; and (c) around the collector regions, vertical MOS transistors which comprise in each case a source region doped oppositely to the emitter layer, a channel region doped with the same polarity as the collector region, the base layer and an insulated gate electrode arranged above the channel region.

Such a component is known in the form of an IGBT (Insulated Gate Bipolar Transistor) or IGT (Insulated Gate Transistor), for example from the article by T.P.Chow et al., IEEE Electron Dev. Lett., EDL-6, pages 413–415 (1985).

DISCUSSION OF BACKGROUND

Corresponding to the hitherto usual, traditional power semiconductor components transistor and thyristor, concepts of making these components controllable via an MOS gate exist today. These concepts are derived from the successful DMOS technology for MOS power transistors.

The first IGBTs (Insulated Gate Bipolar Transistors) have recently become commercially available. In these components, an integrated MOSFET supplies the necessary base current for a vertical bipolar transistor.

MOS-controlled thyristors (MCTs) are not yet available but are being intensively developed by several suppliers. The production of both components is usually based on reliable processes from the production of power MOSFETs.

The IGBT already attracts great attention among many users because it can be controlled in a very simple manner because of the MOS gate and has the characteristic of current saturation. It is especially the effect of current saturation which imparts a particularly great electric robustness to the IGBT and thus allows very simple protective techniques to be used.

In the estimation of many users, the IGBT is more attractive, for the above reasons, than, for instance, the MCT which of course has the non-saturating characteristic of a diode in the switched-on condition. According to the current state of the art, however, there are also (essentially two) points of criticism of the IGBT:

(a) the charge carrier modulation of the drift region carrying blocking voltage is only possible to a limited extent with the currently known IGBT configurations. It is therefore difficult to implement maximum blocking voltages of significantly more than 1 kV whilst obtaining the still acceptable ON resistances at the same time;

(b) all known IGBTs have a parasitic p-n-p-n structure which can latch up, particularly with high anode current densities. If this happens, the component is no longer controllable via the MOS gate and can be destroyed by overcurrent or overtemperature. Although this unwanted effect is being counteracted by various measures, it has not been possible to avoid it completely until now.

SUMMARY OF THE INVENTION

Accordingly, one object of this invention is to provide a novel power semiconductor component which exhibits the advantages of the IGBT with a structure similar to the IGBT but no longer has the disadvantage mentioned at (b) and brings a distinct improvement with respect to (a).

In a component of the type initially mentioned, the object is achieved by the fact that (d) a recombination layer, which is doped highly and with the same polarity as the base layer is arranged within the base layer between the collector regions and the emitter layer, which recombination layer subdivides the base layer into an upper base layer and a lower base layer; and (e) the recombination layer exhibits a plurality of openings by means of which the upper base layer is connected to the lower base layer.

The core of the invention consists in providing, on the basis of a known IGBT structure, an additional, highly doped recombination layer in the vicinity of the cathode in the base layer, thus producing a series circuit of MOSFET and PIN diode.

A preferred illustrative embodiment of the invention is distinguished by the fact that the upper and lower base layer have the same doping concentration.

Further illustrative embodiments of the invention are obtained from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
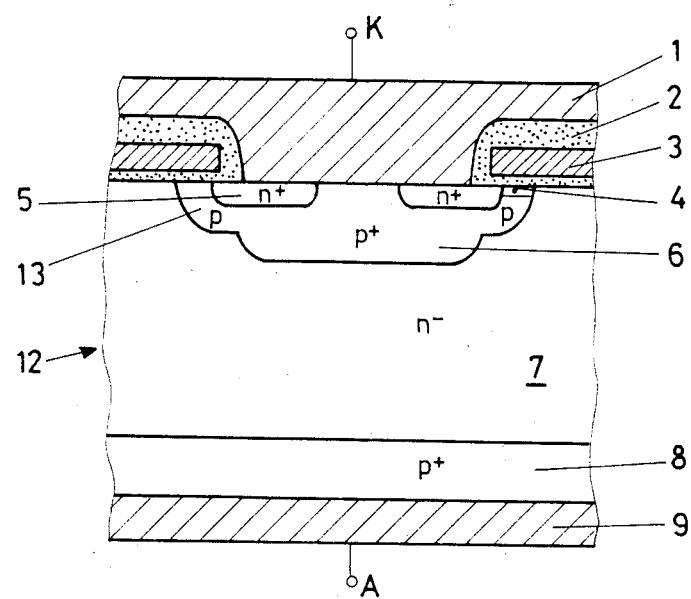
FIG. 1 shows the structure of an IGBT in accordance with the prior art.

Referring now to the drawings, wherein like reference numerals designate identical or corresponding parts throughout the several views, FIG. 1 shows an IGBT according to the current state of the art. In a semiconductor substrate 12 (for example of Si), a p+-doped emitter layer 8 and an n.-doped base layer 7 are arranged between an anode A and a cathode K and a plurality of p+-doped collector regions 6 are arranged at the cathode side.

The emitter layer 8 is contacted by an anode metallization (for example of Al), the collector regions 6 correspondingly by a cathode metallization 1. The collector regions 6 are completely surrounded by vertical MOS transistors which consist of n+-doped source regions 5, p-doped channel regions 13, the base layer 7 and insulated gate electrodes 3 (for example of poly-Si).

The gate electrodes 3 are arranged above the channel regions 13 and separated from the semiconductor substrate 12 and the cathode metallization 1 by a gate insulation 2 (for example of $SiO_2$). With a suitable bias voltage, they generate an inversion channel 4 in the channel regions 13.

Figure 2:
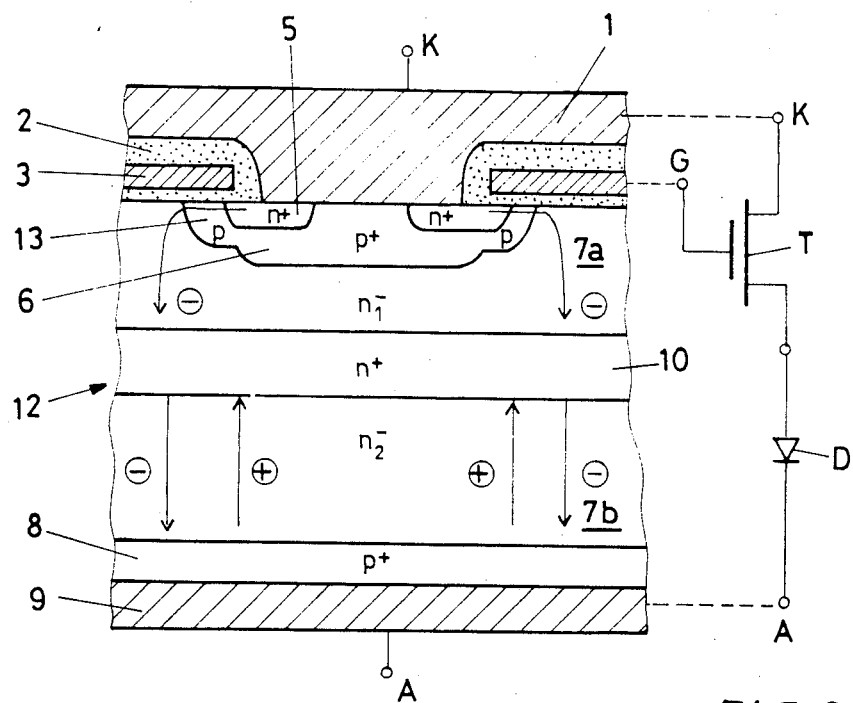
FIG. 2 shows a first embodiment of a component according to the invention with continuous recombination layer and the corresponding equivalent circuit diagram.

The embodiment of the novel improved component according to the invention, shown in FIG. 2, exhibits inside the $n^-$-doped base layer a further highly n-doped layer, the recombination layer 10. The originally uniform base layer 7 is thus split into an upper base layer 7a with the $n_1^-$ doping and a lower base layer 7b with the $n_2^-$ doping.

The anode-side part of the new component with the recombination layer 10 of the lower base layer 7b and the emitter layer 8 has the configuration of a PIN diode known from power electronics.

The cathode side of the new component contains a vertical DMOS structure such as is used almost exclusively in power MOSFETs. The drain region of this MOSFET forms the newly added highly n-doped recombination layer 10.

Overall, this is therefore—as indicated by the equivalent circuit drawn in FIG. 2—a series circuit of MOSFET T and PIN diode D. In this arrangement, the gate G is formed by the gate electrodes 3. Although this series circuit is frequently also used as equivalent circuit for the conventional IGBT according to FIG. 1, it cannot quite meet the requirements of the physical characteristics of that component.

The recombination layer 10 has the following function: as previously mentioned, the recombination layer 10 is, at the same time, an emitter of electrons for the PIN diode D and drain for the MOSFET T. If this layer is constructed as emitter which is not transparent to holes, all holes injected by the emitter layer 8 will recombine there.

Thus, in contrast to the conventional IGBT, the holes are kept away form the source and channel regions 5 and 13, respectively, of the MOSFET. However, this is exactly what eliminates the cause of the latch-up of the IGBT: since the holes are no longer collected by the collector regions 6—because they already recombine in the recombination layer 10 in the new component—, no potential drop can be produced against the less highly p-doped channel regions 13 underneath the source regions 5.

According to the generally accepted knowledge, however, it is exactly such a potential difference which polarizes areas of transition between the collector region 6 and base layer 7 in the forward direction and thus initiates the latch-up of the parasitic p-n-p-n structure.

Since the parasitic latch-up is suppressed in the novel component for the abovementioned reasons, the MOS section can be designed without compromise for high currentcarrying capability (with short channels, small elementary cells and high packing densities). In the conventional IGBT, in contrast, such measures would lead to a significant reduction of the latch-up current intensities (see also the article by T.P. Chow et al. initially mentioned).

In the novel component the upper base layer 7a should preferably have a thickness of a few μm. In this case, the resistance of the MOS section can be kept very low, as is usual with power MOSFETs for low blocking voltages and can be neglected compared with the resistance of PIN diode D.

In addition, the doping of the upper base layer 7a should be identical to the doping of the lower base layer 7b (the drift region of the PIN diode D) in order to achieve high breakdown voltages.

The incorporation of the recombination layer also results in a current density homogeneity which is improved compared with the IGBT. Using the same Si substrate, it is therefore possible to achieve lower forward resistances with the novel component than with a conventional IGBT.

The capability of forward blocking is indispensable in components of the IGBT type. With the structure according to FIG. 2, however, only the upper base layer 7a can accommodate blocking voltage. The additionally incorporated recombination layer 10 blocks a spreading of the space charge zone into the lower base layer 7b. Since, however, the upper base layer 7a only exhibits a small thickness (a few μm), the component also only has a low blocking voltage which corresponds to the doping and thickness of this layer.

Figure 3:
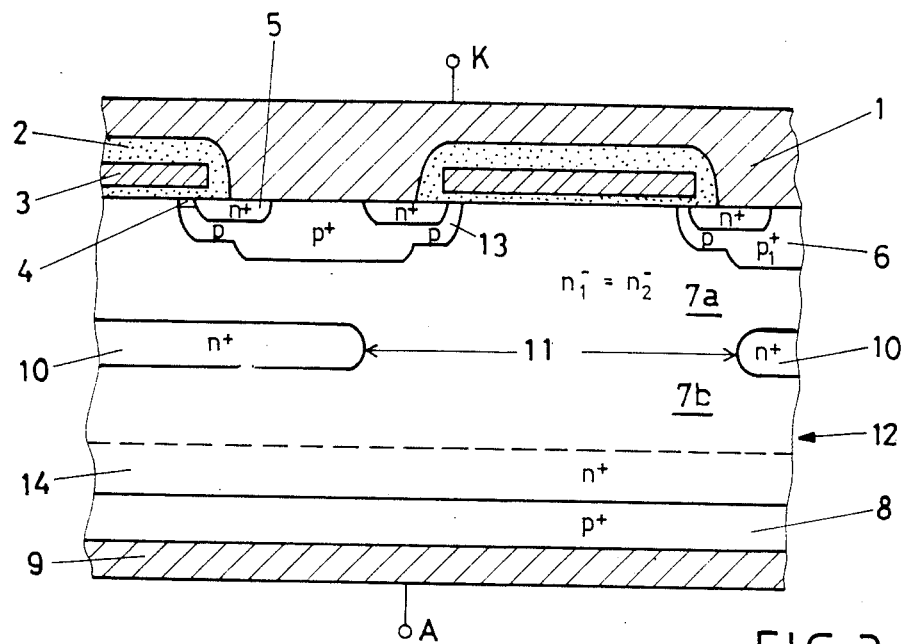
FIG. 3 shows a second embodiment of a component according to the invention having additional openings in the recombination layer.

As shown in FIG. 3, it is therefore necessary to provide openings 11 in the recombination layer 10 so that the upper and lower base layer 7a and 7b, respectively, are connected to one another. When the blocking voltage is being built up, the field can now penetrate through the recombination layer 10 and spread out in the wide space of the lower base layer 7b. This ensures that the novel component is no longer limited in blocking voltage.

In addition, an n+-doped n-stop layer 14 (drawn dashed in FIG. 3), which is known from the prior art, can also be provided between the lower base layer 7b and the emitter layer 8.

Several aspects must be taken into consideration for the arrangement of the recombination layer 10 provided with the openings 11: the individual areas of the recombination layer 10 should have lateral dimensions which are not too large so that no significant potential differences can build up over these distances.

For a further aspect, the parasitic latch-up process in the IGBT will be referred to again: some of the holes coming from the anode A (the emitter layer 8) do not pass directly into the collector regions 6 but follow approximately the paths of the electrons (due to the charge carrier modulation, this is a path of particularly low electrical resistance). These holes penetrate via the channel regions 13 into the collector regions 6 and, because of the low doping necessary for implementing an inversion layer, can generate a voltage drop in the channel regions 13 which leads to a forward polarization of the corresponding diode.

Figure 4:
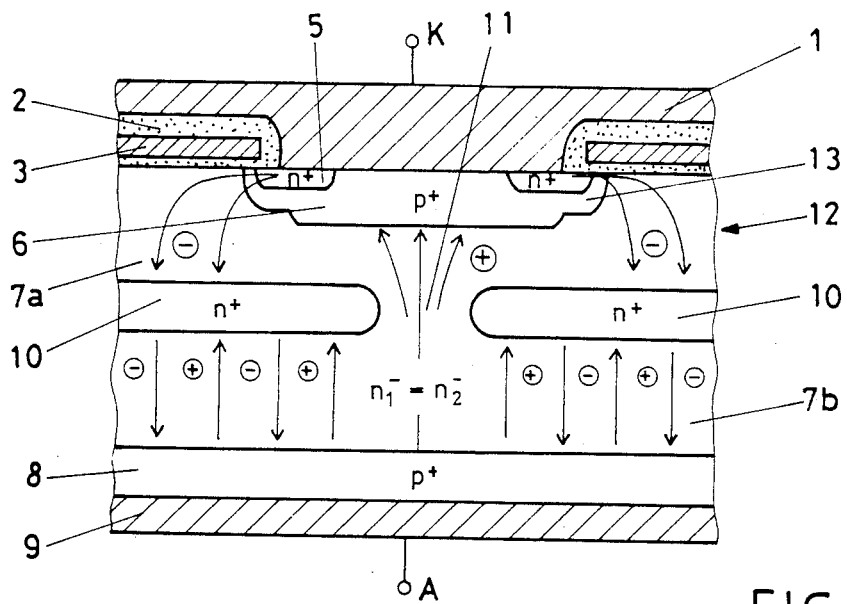
FIG. 4 shows an embodiment similar to FIG. 3, in which the openings are in each case arranged underneath the collector regions.

It is therefore advantageous to place the areas of the recombination layer 10 underneath the inversion channels 4, the gate electrodes 3 and the channel regions 13 (FIG. 4), as far as possible, and thus to prevent the holes from penetrating into the critical areas of the component by "forced recombination" (in FIG. 4, the hole and electron currents are shown diagrammatically by arrows with plus and minus symbols). Correspondingly, the openings 11 should be arranged exactly underneath the collector regions 6. Thus, the conventional paths, also known from IGBT, to the cathode K are available to the holes.

Figure 5:
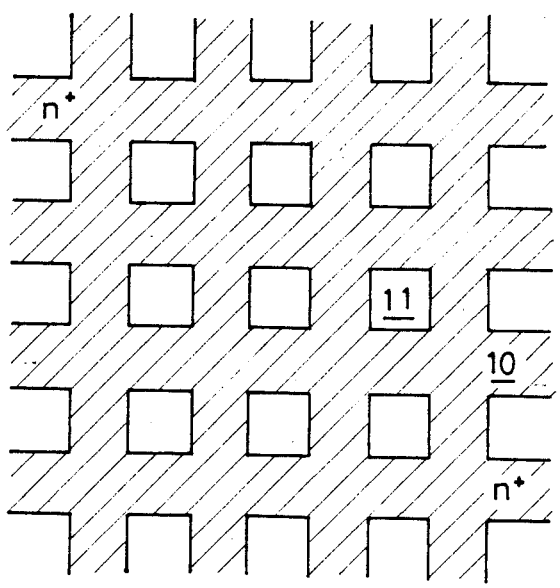
FIG. 5 shows the lateral structure of the recombination layer in a component according to FIG. 4.

In the case of a component structure consisting of square or rectangular cells, the recombination layer 10 (in a top view of the wafer) has correspondingly the shape of a grid network with square or rectangular openings 11 (FIG. 5). For the rest, the shape of the perforated recombination layer 10 can be adapted without problems to all cell structures currently known from the IGBT.

The following comments on the production technology for a component according to the invention may be added: the recombination layers 10 proposed here are comparable with the buried collectors known from the bipolar technology. Conventional techniques of silicon epitaxy can therefore be used for producing the MOS-controlled PIN diode described.

A possible process consists in performing the $n^+$-doping for the grid network of the recombination layer 10, after the generation of the emitter layer 8, by a mask of appropriate structure. An ion implantation of, for example, arsenic is particularly suitable for this purpose.

This is followed by an epitaxy step in which the upper base layer 7a with a thickness of a few $\mu$m is generated. Following this part-process, the MOS control head can be produced with the known process steps.

Finally, it should also be pointed out that, naturally, the component according to the invention can also be constructed in a complementary arrangement. This complementary component is distinguished by the fact that the base layers 7, 7a, 7b are $p^-$-doped, the collector regions 6 and the emitter layer 8 are $n^+$-doped, the channel regions 13 are n-doped and the source regions 5 and the recombination layer 10 are $p^+$-doped.

If an additional stop layer is provided between the lower base layer 7b and emitter layer 8 in this component, this is a $p^+$-doped p-stop layer which is arranged in the same manner as the complementary n-stop layer 14 in FIG. 3.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the U.S. is:

1. An MOS-controlled bipolar power semiconductor component comprising
   (a) a semiconductor substrate (12) with an anode (A) and a cathode (K);
   (b) an emitter layer (8) on the anode side in the semiconductor substrate (12), in the center a base layer (7) doped oppositely to the emitter layer (8), and on the cathode side a plurality of collector regions (6) which protrude from the surface of the semiconductor substrate (12) into the base layer (7) and are doped with the same polarity as the emitter layer (8); and
   (c) around the collector regions (6), vertical MOS transistors which comprise in each case a source region (5) doped oppositely to the emitter layer (8), a channel region (13) doped with the same polarity as the collector region (6), the base layer (7) and an insulated gate electrode (3) arranged above the channel region (13); wherein
   (d) a recombination layer (10) which is doped highly and with the same polarity as the base layer (7) is arranged within the base layer (7) between the collector regions (6) and the emitter layer (8), which recombination layer (10) subdivides the base layer (7) into an upper base layer (7a) and a lower base layer (7b); and
   (e) the recombination layer (10) exhibits a plurality of openings (11) by means of which the upper base layer (7a) is connected to the lower base layer (7b).

2. The component as claimed in claim 1, wherein the upper base layer (7a) has a thickness of only a few $\mu$m.

3. The component as claimed in claim 2, wherein the upper and lower base layer (7a and 7b, respectively) have the same doping concentration.

4. The component as claimed in claim 1, wherein the openings (11) are in each case arranged underneath the collector regions (6).

5. The component as claimed in claim 4, wherein the openings (11) are rectangular or square and the recombination layer (10) has the form of a grid network.

6. The component as claimed in one of claims 1 to 5, wherein the base layers (7, 7a, 7b) are $n^-$-doped, the collector regions (6) and the emitter layer (8) are $p^+$-doped, the channel regions (13) are p-doped and the source regions (5) and the recombination layer (10) are $n^+$-doped.

7. The component as claimed in claim 6, wherein an $n^+$-doped n-stop layer (14) is arranged between the lower base layer (7b) and the emitter layer (8).

8. The component as claimed in one of claims 1 to 5, wherein the base layers (7, 7a, 7b) are $p^-$-doped, the collector regions (6) and the emitter layer (8) are $n^+$-doped, the channel regions (13) are n-doped and the source regions (5) and the recombination layer (10) are $p^+$-doped.

9. The component as claimed in claim 8, wherein a $p^+$-doped p-stop layer is arranged between the lower base layer (7b) and the emitter layer (8).

* * * * *